(12) United States Patent
Gao

(10) Patent No.: US 11,482,765 B2
(45) Date of Patent: Oct. 25, 2022

(54) THERMOELECTRIC COOLER CASCADED PACKAGING FOR CELL DENSE ARRANGEMENT

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 5 days.

(21) Appl. No.: 16/901,889

(22) Filed: Jun. 15, 2020

(65) Prior Publication Data

US 2021/0391564 A1    Dec. 16, 2021

(51) Int. Cl.
*H01L 35/32* (2006.01)
*H01M 50/581* (2021.01)
*F25B 21/02* (2006.01)
*H01L 35/30* (2006.01)

(52) U.S. Cl.
CPC .......... *H01M 50/581* (2021.01); *F25B 21/02* (2013.01); *H01L 35/30* (2013.01); *H01L 35/325* (2013.01)

(58) Field of Classification Search
CPC .. H01L 35/00–34; H01L 27/16; H01M 10/00; H01M 10/60
USPC ................................. 136/243–265, 200–242
See application file for complete search history.

(56) References Cited

U.S. PATENT DOCUMENTS

| | | | | |
|---|---|---|---|---|
| 2006/0060236 A1* | 3/2006 | Kim | ..................... | H01M 10/625 136/203 |
| 2010/0136406 A1* | 6/2010 | Song | ................. | H01M 10/6557 429/120 |
| 2012/0249076 A1* | 10/2012 | Birke | .................. | H01M 10/613 320/131 |
| 2020/0119248 A1* | 4/2020 | Lee | ......................... | H01L 35/10 |

FOREIGN PATENT DOCUMENTS

| | | | |
|---|---|---|---|
| DE | 102017117065 | * | 1/2019 |
| JP | WO2013008882 | * | 1/2013 |

OTHER PUBLICATIONS

DE102017117065 English translation (Year: 2017).*

* cited by examiner

*Primary Examiner* — Bach T Dinh
(74) *Attorney, Agent, or Firm* — Womble Bond Dickinson (US) LLP

(57) ABSTRACT

A multi-stage cascaded thermoelectrical cooler (TEC) package is used in conjunction with an air cooling system to control temperature of battery cells in a battery module such that the temperature differences stay within a predetermined range. Battery cells in the battery module are divided into one or more regular sections and one or more TEC enhancing sections. A regular section and a TEC enhancing section can use different types of battery cell holders to assemble the battery cells. TECs in the TEC package are integrated into each enhancing section, where each stage of the TEC package is attached to one or more battery cells in a different region of the enhancing section. A higher stage, which is (Continued)

more powerful in enhancing heat transfer and extracting heat from battery cells, is attached to one or more battery cells in a section closer to the air outlet. The TEC package is powered by a discharging convertor circuit of the battery module.

20 Claims, 12 Drawing Sheets

US 11,482,765 B2

THERMOELECTRIC COOLER CASCADED PACKAGING FOR CELL DENSE ARRANGEMENT

FIELD OF THE INVENTION

Embodiments of the present disclosure relate generally to electronic cooling in a battery module. More particularly, embodiments of the disclosure relate to a multi-stage cascaded thermoelectrical cooler (TEC) package for enhancing transfer of heat in battery cells in a battery module.

BACKGROUND

Use of a battery backup unit (BBU) in place of traditional solutions, such as lead-acid based Uninterruptible Power Supply (UPS) systems, has grown in popularity in the vehicle industry and data centers.

A BBU package typically uses cooling air to cool battery cells in the BBU package. Due to heat transfer from the battery cells to the cooling air during the discharging cycles of the battery cells, the cooling air becomes increasingly hotter as it travels through the battery cells, which can result in a thermal gradient between colder battery cells and hotter battery cells which are arranged in different rows along the airflow direction in the package.

Battery cells in different temperatures tend to have different states of health, which impacts the performance of the BBU package, and creates safety risks.

However, it would be costly and require complex designs to use an air cooling system alone to regulate temperatures of battery cells in a BBU package such that each battery cell may have a similar temperature. Further, a complex air cooling system may need a large space for more cooling air to flow through the battery cells, thereby preventing the BBU package from increasing its energy density. Even with a complex air cooling system, the temperature gradient described above may cause some hard limitations on the system design and availability.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
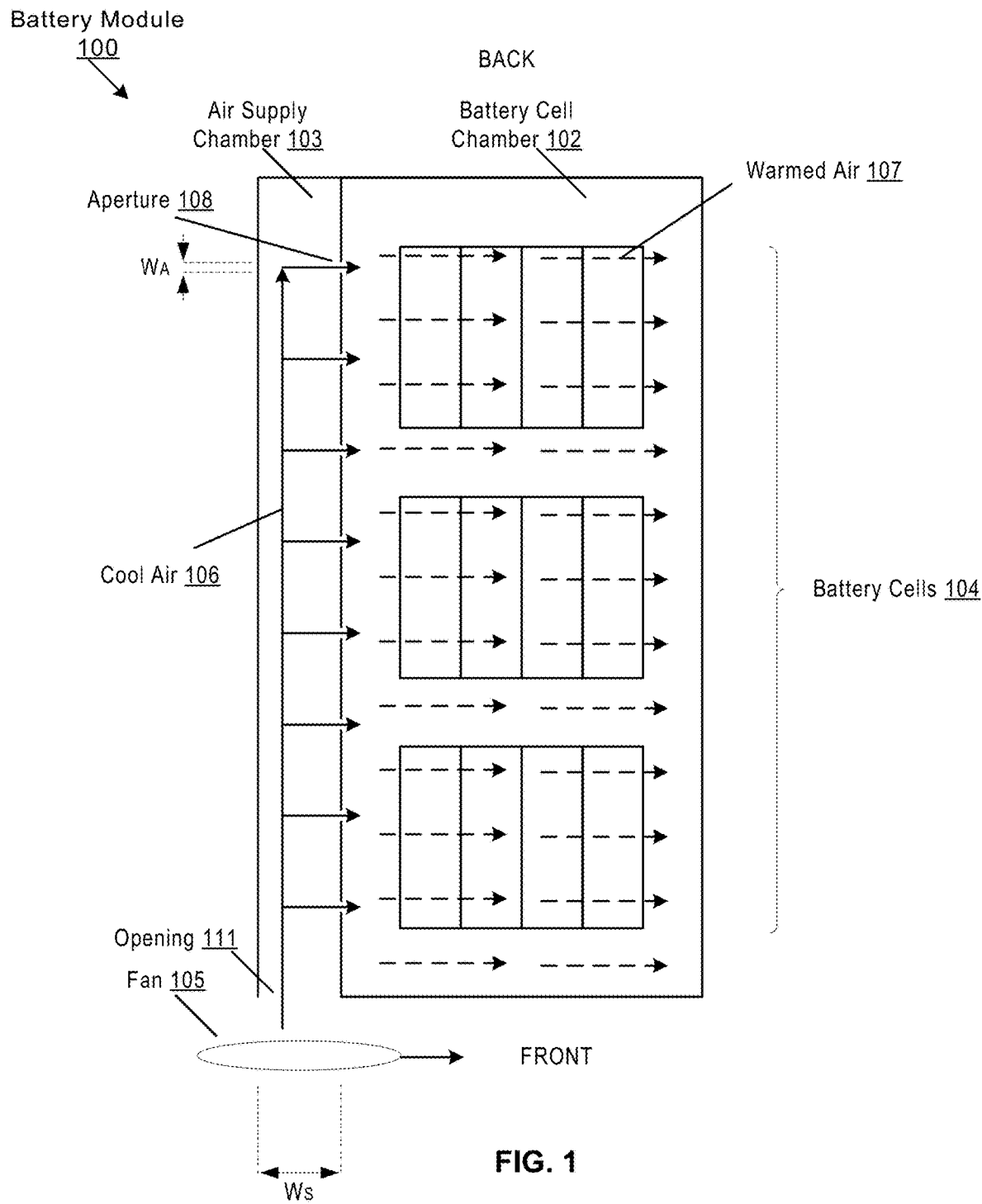
FIG. 1 is a block diagram illustrating an example of a battery module that includes an air supply chamber and a battery cell chamber according to one embodiment

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to various embodiments, described herein are systems and methods for controlling temperatures of battery cells in a battery module using a multi-stage cascaded thermoelectrical cooler (TEC) package, such that temperature differences among the battery cells stay within a predetermined range.

In one embodiment, the battery module that is to be cooled using cooling air can be divided into a number of sections, including one or more regular sections and one or more TEC enhancing sections. An enhancing section is closer to a cooling air outlet than a regular section, and therefore has a higher temperature than the regular section. TECs in the TEC package can be integrated into an enhancing section, where each stage of the TEC package is attached to one or more battery cells in a different region of the enhancing section. A higher stage, which is more powerful in enhancing heat transfer and cooling of the battery cells, can be attached to one or more battery cells in a section closer to the cooling air outlet. The TEC package is powered by a discharging convertor circuit of the battery module, and therefore functions only during discharging cycles of the battery cells.

The systems and methods described herein, by combining an air cooling system and a multi-stage cascaded TEC package for controlling battery cell temperatures, can simplify the design of the battery module and reduce its cost, while maintaining a high energy density of the battery module.

In one embodiment, TECs in the TEC package are enclosed in a TEC holder, which can be attached to heat sink fins or cold plates on one side. The TEC holder can be assembled with a heat sink, or a cold plate as one single unit. In one embodiment, the TEC holder can be integrated with a battery cell holder on the opposite side to the heat sink fins or the cold plate. In another embodiment, a battery cell holder is not part of the TEC holder. However, the TEC package can be attached to a battery cell holder. The TECs are used to cover areas in the longitudinal direction of a battery cell for offloading cooling in this direction, and each of the TECs can also be attached to an end of a battery cell. Therefore, in one embodiment, TECs are used for enhancing the heat transfer in both longitudinal and axial direction.

FIG. 1 shows a block diagram illustrating an example of a battery module that includes an air supply chamber and a battery cell chamber according to one embodiment. Specifically, this figure shows a top-down cross-sectional view of a battery module 100 that includes a battery cell (or first) chamber 102 and an air supply (or second) chamber 103 that is to a side (e.g., a left side) of the battery cell chamber 102. In one embodiment, the module may have any shape and configuration. For example, as illustrated, the battery module is a rectangular box. In other embodiments, however, the module may be a square box or a cylinder, for example.

The battery cell chamber includes battery cells 104 (e.g., three groups of four battery cells) that may be series connected, parallel connected, or a combination thereof. The battery cells may be of any type, such as Lithium-ion, Nickel Cadmium, etc. The battery cells are configured to provide battery energy stored within the battery cells to a load (e.g., the load may be at least one server as described herein), and are configured to draw power from an external power supply (or source) to charge the battery cells. In one embodiment, rather than including multiple battery cells, the module may include only one battery cell.

As illustrated, the air supply chamber 103 includes an opening 111 (at a front of the module) that is configured to receive cool air from a fan 105. In one embodiment, the opening 111 may be in any position (e.g., at a side of the module, at a back of the module, etc.). In one embodiment, the fan may be positioned at (or next to) the opening of the chamber 103. In another embodiment, there may be two or more fans at (or near) the opening of the air supply chamber. As described herein, the fan 105 may be a part of the battery module or separate from the battery module. For example, the fan may be a part of a fan module that is removably coupled (e.g., via a duct) to the battery module. In another example, the fan may be a part of a data-center cooling system, such as a computer room air conditioning (CRAC) unit. For instance, the cool air may be supplied (e.g., via a duct) to the air supply chamber 103 driven by the air movers in (e.g., a blower of) the CRAC unit.

As described herein, during operation of the battery module (e.g., while the battery cells 104 are discharging/charging), heat may be generated by the battery cells inside the battery cell chamber 102. To cool the battery cells, the fan 105 is configured to push cool air 106 through the opening 111 and into the air supply chamber 103. This cool air 106 is pushed through several (e.g., eight) apertures 108 (openings or holes) into the battery cell chamber 102. The cool air that enters the battery cell chamber through the apertures travels through the battery cell chamber, absorbing the generated heat through forced convection. Specifically, the cool air is pushed towards the battery cells and comes into contact with the hot (or heated) surface of the battery cells. Since the air is cooler than the surface, heat is exchanged thereby producing warmed air 107 (e.g., air that is warmer than the cool air 106) and cooler (or cooled) battery cells.

In one embodiment, there may be more (or less) apertures. For example, in this figure, there are eight apertures that are supplying air that is being pushed up against and over the battery cells 104. As another example there may be multiple rows of apertures, each row at a different height in order to evenly distribute the air into the battery cell chamber 102.

In one embodiment, the cool air 106 inside the air supply chamber 103 may be at a higher pressure than the air (e.g., warmer air 107) in the battery cell chamber 102. In some embodiments, to maintain a higher pressure, the opening 111 at which cool air is supplied into the air supply chamber 103 may have a first width, $W_S$, and each of the apertures through which the cool air is pushed into the battery cell chamber 102 may each have a second width, $W_A$, which is less than the first width. As a result of the cool air being at a higher pressure, the apertures are configured to supply the cool air into the battery cell chamber at a higher air flow rate (or velocity) than an air-flow rate at which the fan 105 pushes the cool air through the opening 111. By pushing the cool air into the battery cell chamber 102 at a high velocity, heat transfer by convection may be increased, thereby cooling the battery cells more efficiently and/or more rapidly. In one embodiment, the battery module 100 may include vents that allow the warmed air to exit the module. Specifically, the battery cell chamber 102 may include one or more vents or perforated openings on a side that is opposite of the air supply chamber 103 and/or may include vents or perforated openings at a back of the chamber.

In one embodiment, the supply chamber 103 may be positioned to (better) evenly cool the battery cells 104. In conventional air cooling systems, fans may be positioned at a front (or back) of an electronic device (or battery), where air is pushed from the front towards the back. In the case of a battery, although this may efficiently cool battery cells that are closer to the front, battery cells to the back, however, will not be cooled as efficiently. As a result, there will be a large thermal gradient between the cooler battery cells at the front and the warmer battery cells to the back. Battery cells with different internal temperatures may adversely affect performance. In the present disclosure, the air supply chamber 103 is positioned on a (e.g., left) side of the battery cell chamber 102. In one embodiment, the air supply chamber 103 may be positioned on any side of the chamber (e.g., a right side). The chamber 103 evenly supplies (or distributes) cool air 106 from one side of the battery cell chamber 102 towards another. By supplying the air on the side, the battery cells may be evenly cooled because the cool air may come into contact with more surface area of the battery cells, and the air may have a shorter distance to travel (with respect to front to back of the module) since the module is of a rectangular shape.

Figure 2:
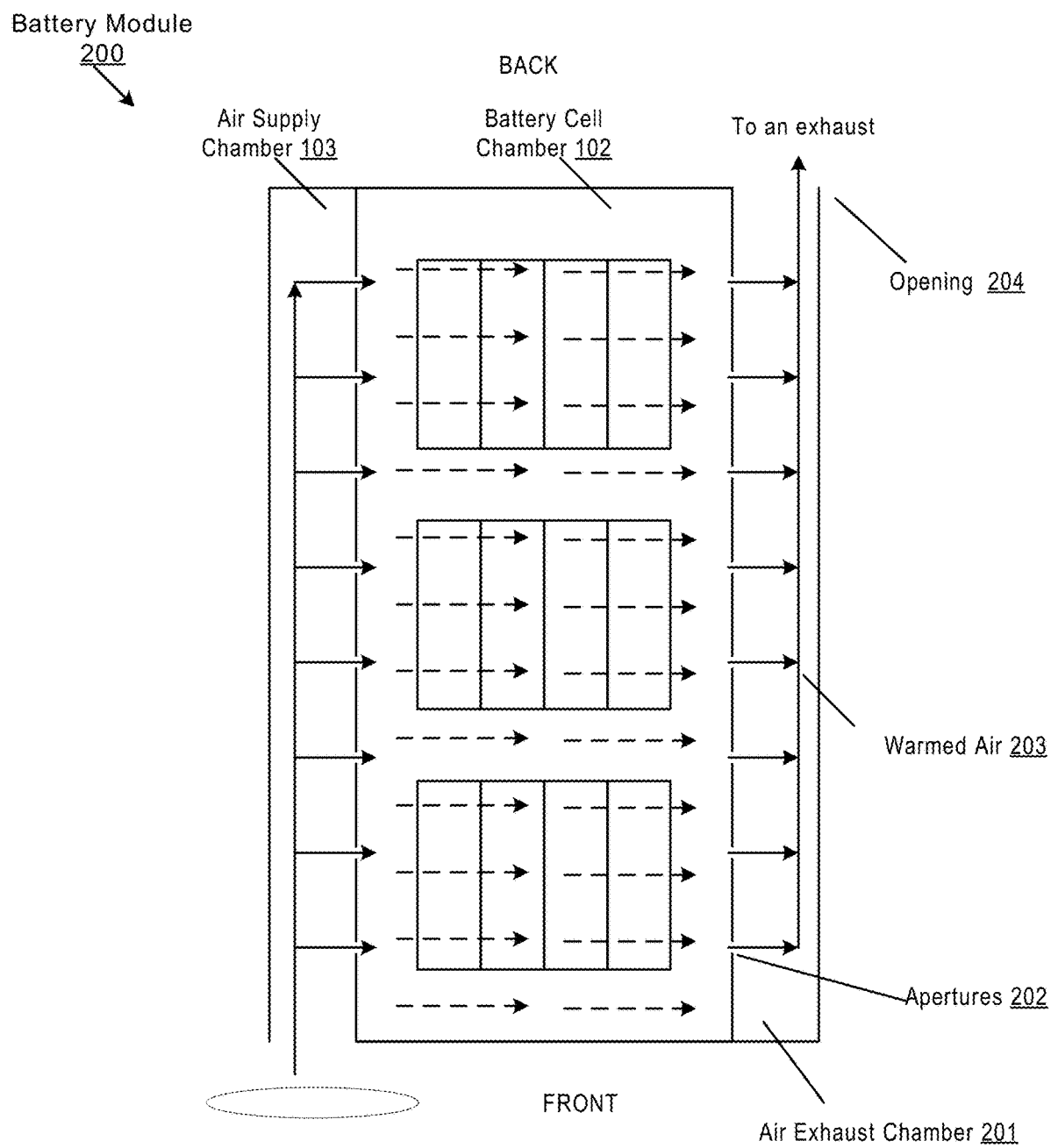
FIG. 2 is a block diagram illustrating an example of a battery module that includes multiple air chambers according to one embodiment.

FIG. 2 shows a block diagram illustrating an example of a battery module that includes multiple air chambers according to one embodiment. Specifically, this figure shows battery module 200 that includes the battery cell chamber 102, the air supply chamber 103, and an air exhaust (or third) chamber 201. As illustrated, the air supply chamber 103 is on a first (e.g., left) side of the battery cell chamber 102 and the air exhaust chamber 201 is on a second (e.g., right) side of the battery cell chamber 102. The air exhaust chamber 201 is configured to receive (or draw) warmed air 203 from the battery cell chamber 102 (via apertures 202), where the warmed air is produced when the cool air that is supplied to the battery cell chamber 102 by the air supply chamber 103 absorbs the heat generated by the battery cells. The warmed air 203 that is received by the chamber 201 may be expelled out of the battery module through an opening 224 to an exhaust. In some embodiments, the battery module 200 may be coupled to an external exhaust via ducts, or the exhaust may be coupled thereon. In another embodiment, the warmed air 203 may just be expelled out of the battery module through the opening 202 into the environment (e.g., a hot aisle of a database center in which the battery module is located).

In one embodiment, the air supply chamber 103 and air exhaust chamber 201 may be the same size (e.g., width). In another embodiment, the chambers may be sized differently. In some embodiments, the air exhaust chamber 201 may have a same or different number (and/or size) of apertures than the apertures of the air supply chamber 103.

Figure 3:
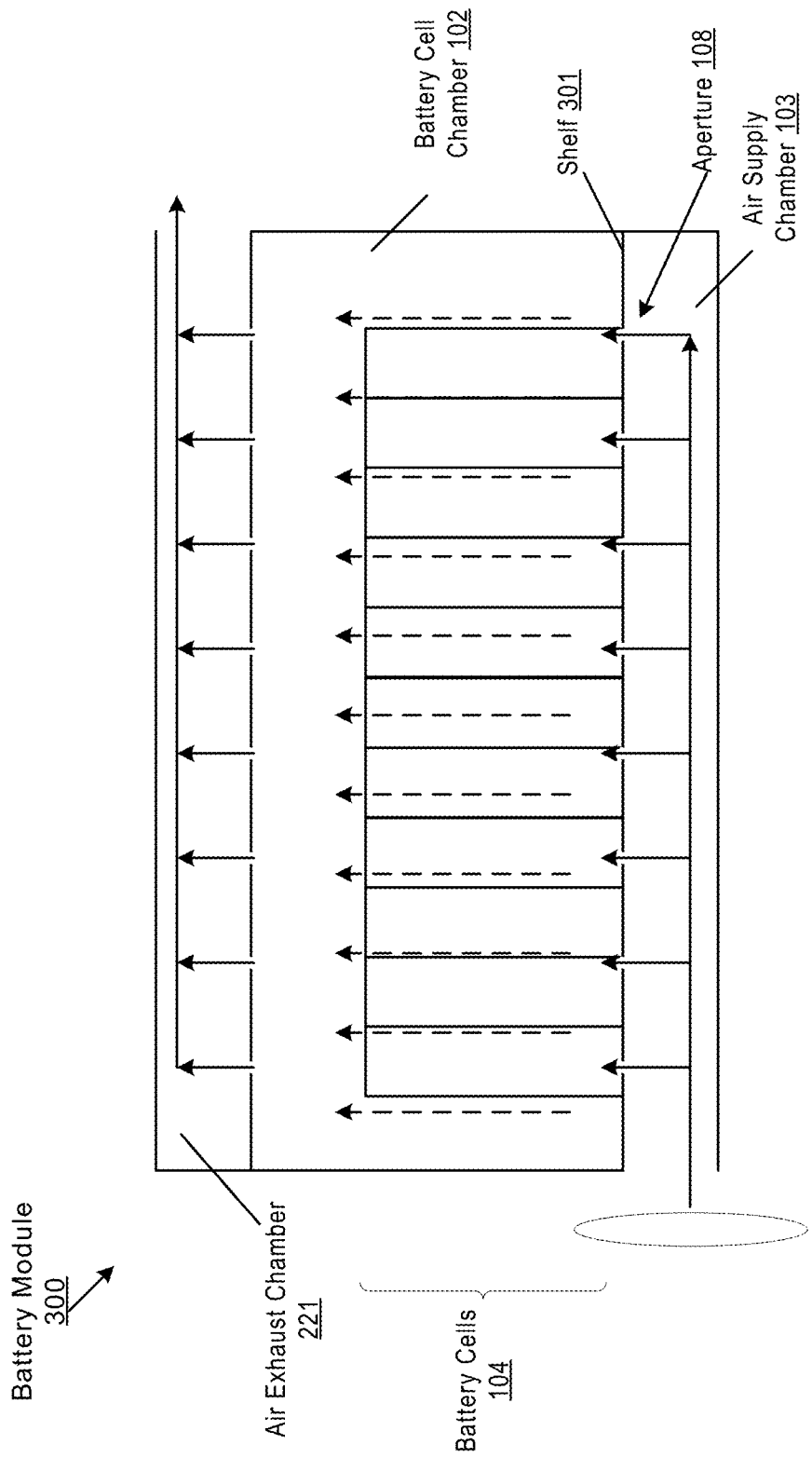
FIG. 3 is a block diagram illustrating an example of another battery module according to one embodiment.

FIG. 3 shows a block diagram illustrating an example of another battery module according to one embodiment. Specifically, this figure shows a profile view of a cross section of a battery module 300 with the air supply chamber 103, the battery cell chamber 102, and the air exhaust chamber 201 each stacked on top of one another. As illustrated, the battery cells 4 are sitting on a shelf 301 that separates the battery cell chamber 102 from the supply chamber 103. During operation, the air supply chamber 103 supplies cool air through the apertures 108 in the shelf 301. The cool air travels upward and when doing so absorbs the heat generated by the battery cells 104 to produce warmed air. The warmed air then continues to travel upward and into the air exhaust chamber 201 to be expelled from the module 300.

Figure 4A:
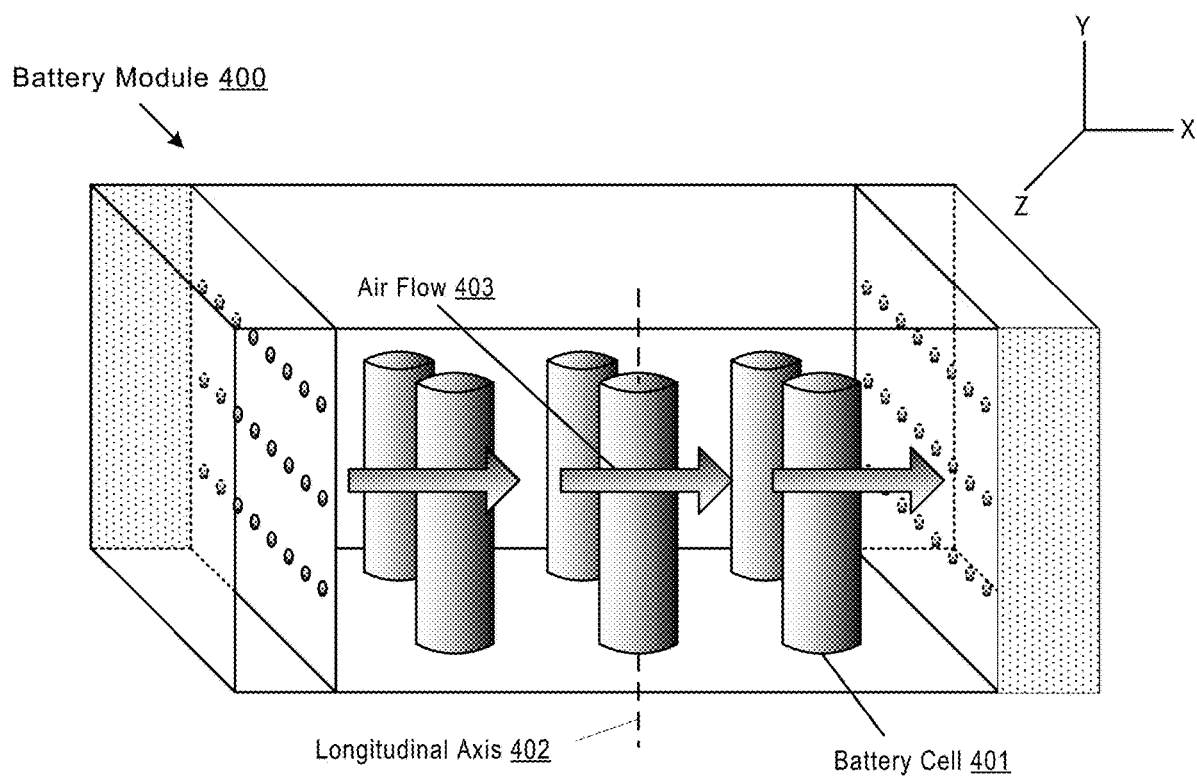
FIGS. 4*a* and 4*b* are block diagrams illustrating different examples of battery cell arrangements according to one embodiment.
Figure 4B:
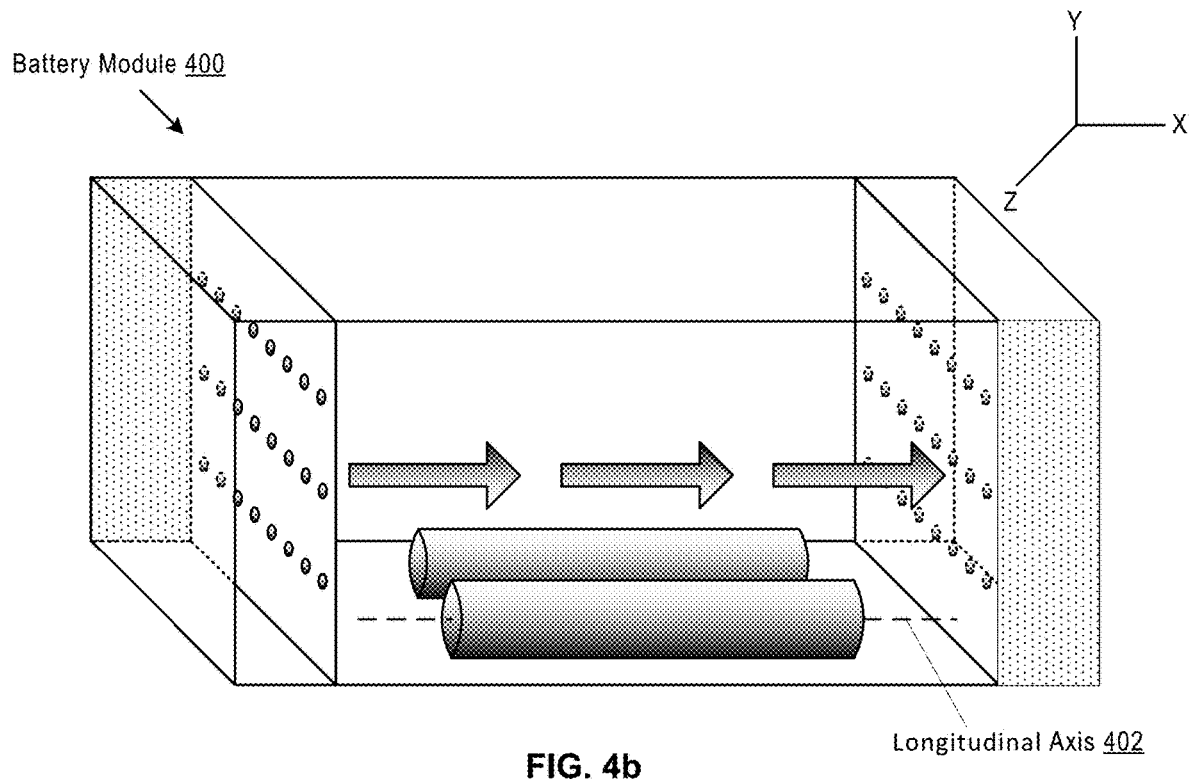

FIGS. 4a and 4b are block diagrams illustrating different examples of battery cell arrangements according to one embodiment. Specifically, both figures illustrate a perspective view of a battery module 400, where each figure has different arrangements of battery cells 401 which are cylindrical shaped battery cells. For example, FIG. 4a shows battery module 400 with two rows of three battery cells 401, where each of the battery cells is upright and has a longitudinal axis 402 that is parallel to the Y-axis. This arrangement may be considered a "cross-flow arrangement" since the air flow 403 that is flowing parallel to the X-axis is perpendicular to the longitudinal axes of the battery cells 401. FIG. 4b shows battery module 400 with two battery cells 401 that are laying down on a bottom of the module, where each of their longitudinal axes is parallel to the X-axis. This arrangement may be considered a "counter-flow arrangement" since the air flow 403 is flowing parallel to the longitudinal axes of the battery cells 401. In one embodiment, the battery cells 401 may be positioned such that a hotter side of the battery (such as a negative terminal of the battery) is closer to the air supply chamber 103.

Figure 5:
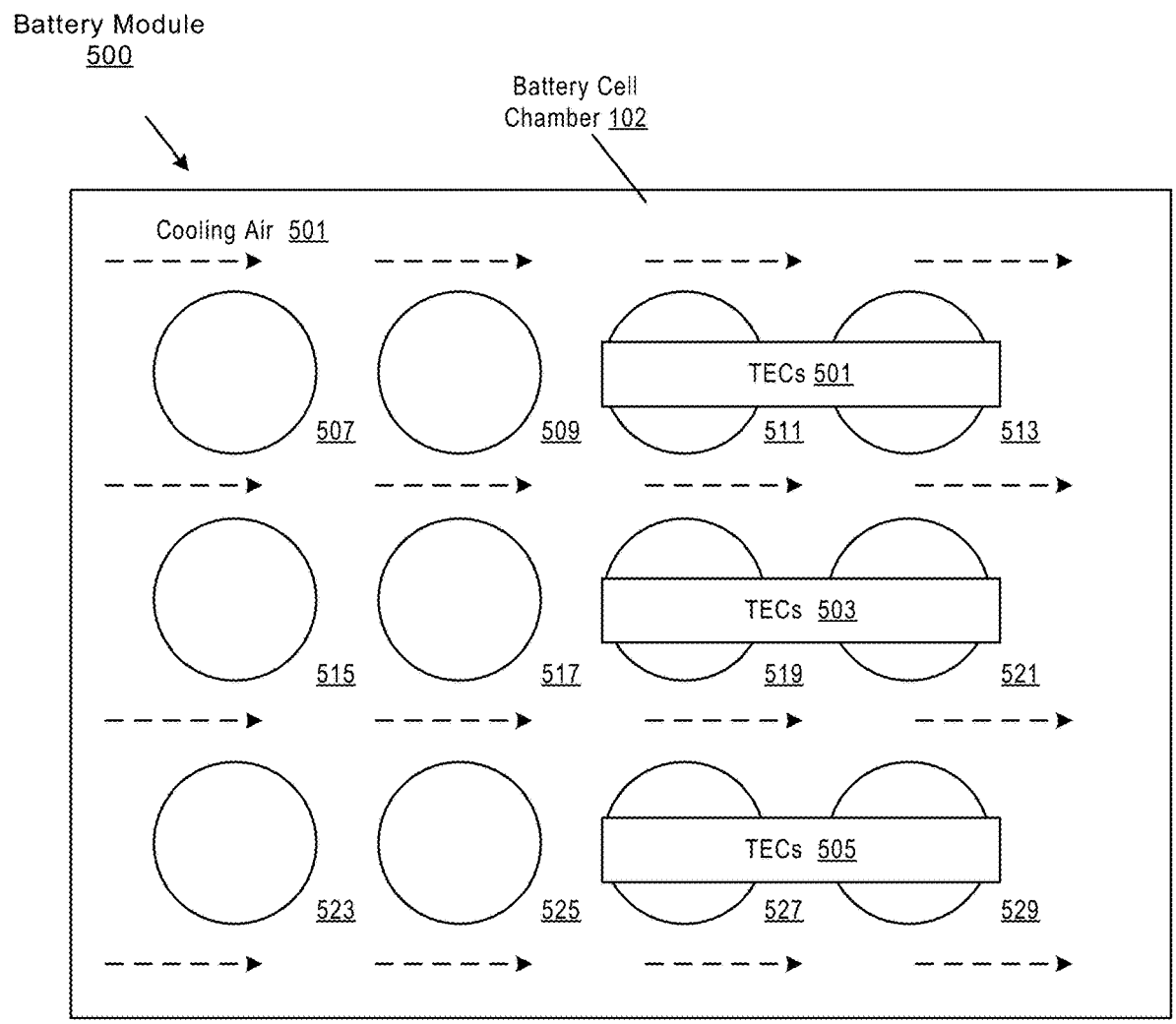
FIG. 5 is a block diagram illustrating an example of a battery module with a TEC package according to one embodiment.

FIG. 5 is a block diagram illustrating an example of a battery module 500 with a TEC package solution according to one embodiment. As shown, the battery module can include multiple battery cells 507-529 that are arranged into multiple rows. The battery cells 507-529 function at the same time during a discharging cycle, and generate almost an identical amount of heat. In one embodiment, the cells may be arranged in different manners such as a staggered one.

As described, cooling air 501 can be drawn from the cooling air supply side (a "cold aisle") to cool the battery cells 507-529. The cooling air 501 can travel through the battery cells 507-529, and leave the battery module 500 from the exhaust side of the package to the hot air region (a "hot aisle). Thus, the battery cells 511, 513, 519, 521, 527, and 529 on the right side to the battery module 500 (closer to the hot aisle) may have a higher temperature than the battery cells 507, 509, 515, 517, 523, and 525 on the left side of the battery module 500 (closer to the cold aisle).

In one embodiment, there may be multiple cells arranged in multiple rows and columns. As the cooling air moves from the left side (inlet) to the right side(outlet), absorbing heat from each cell in each row, the airflow temperature increases when approaching each row. Therefore, without TEC solution, battery cells 507, 515, and 523 are cooler than battery cells 509, 517, and 525. Similarly, battery cells 509, 517 and 525 are cooler than battery cells 511, 519, and 527 and battery cells 511, 519, and 527 are cooler than battery cells 513, 521, and 529. The TECs are mainly used to adjust temperature variations. In the current figure, TECs are used for the last two rows. In another embodiment, TECs may be used only the last row or the last three rows.

In one embodiment, to control temperature differences among the battery cells 507-529 within a predetermined range (e.g., 0-3 Fahrenheit degrees), TECs 501, 503, and 505 can be attached to battery cells in a section close to the outlet of the cooling air 501 to enhance heat transfer and to reduce temperature of the battery cells.

In one embodiment, to control the temperature differences within a predetermined range means that the temperature difference between the coldest battery cell and the hottest battery cell need to stay within this range such that all the battery cells in the battery module may have similar temperatures. Ideally, the temperatures of all the battery cells in the battery module should be identical.

In one embodiment, the battery cells 507-529 can be evenly divided into two sections—a regular section and a thermoelectrical cooler (TEC) enhancing section. The regular section can be on the side closer to the "cold aisle", and the TEC enhancing section (also referred to as enhancing section) can be on the side closer to the "hot aisle".

In this particular implementation, the battery cells 511, 513, 519, 521, 527, and 529 can be in the enhancing section, and the battery cells 507, 509, 515, 517, 523, and 525 can be in the TEC regular section.

In one embodiment, the TECs are only attached to battery cells in the enhancing section where the battery cells are warmer than the battery cells in the regular section due to a higher temperature of the cooling air approaching to the. The TECs 501, 503 and 505 can be arranged in a TEC package, which may include multiple stages in a cascading manner, with each higher stage having a more powerful heat transfer capability or a more powerful thermal reduction capability. Such capabilities can be achieved by using a larger number of TECs or more powerful TECs.

In one embodiment, in the TEC enhancing section, the closer a battery cells is to the "hot aisle", the hotter the battery cell is. Therefore, the battery cell 513 is hotter than the battery cell 511, the battery cell 521 is hotter than the battery cell 519, and the battery cell 529 is hotter than the battery cell 527. Accordingly, to ensure that all the battery cells have a similar temperature, a higher stage of the TEC package can cover the hotter battery cells, and a lower stage of the TEC package can cover the colder battery cells in the TEC enhancing section.

Figure 6A:
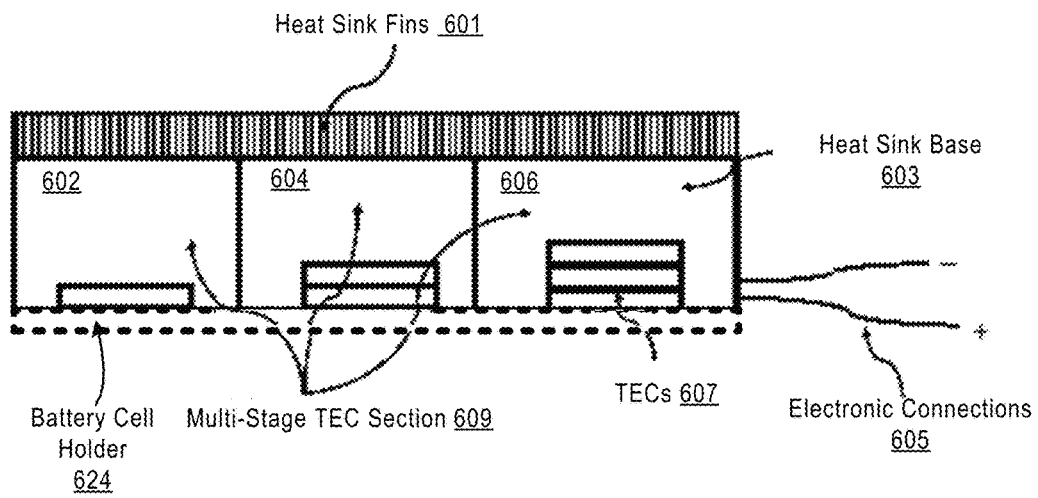
FIGS. 6A-6C show examples of a TEC package according to various embodiments.
Figure 6B:
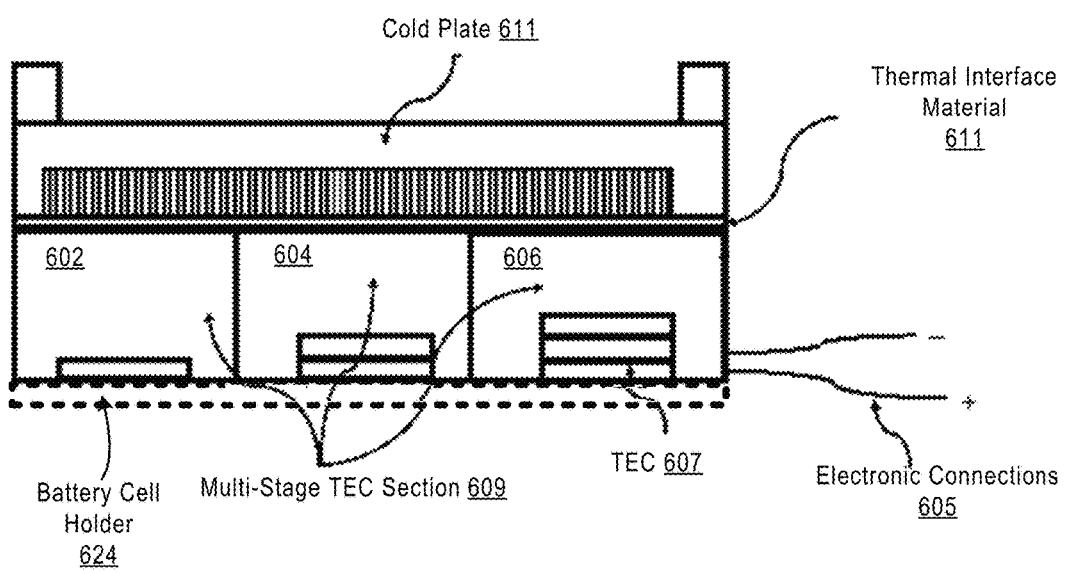
Figure 6C:
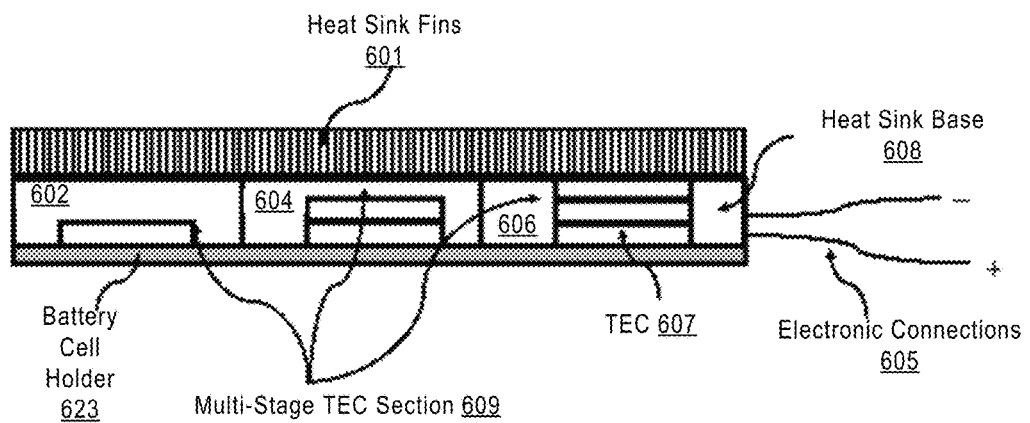

FIGS. 6A-6C show examples of a TEC package according to various embodiments. As shown in the figures, three different embodiments of a TEC package are shown. The main part of each TEC package is a multi-stage TEC section 609, which includes a number of stages 602, 604 and 606, each higher stage including a larger number of TECs. For example, the first stage 602 includes one TEC, the second stage 604 includes 2 TECS, and the third stage 606 includes three TECs 607.

In one embodiment, each TEC in the TEC packages as shown by the figures operates according to the Peltier effect, which creates a temperature difference by transferring heat between two electrical junctions. When an electric current flows through the junctions of the two conductors, heat is removed at one junction and cooling occurs.

Although each of the TEC packages in the figures includes three stages of TECs, with the first stage having one TEC, the second stage having two TECs, and the third stage having three TECs, each TEC package can include as many stages as needed in actual implementations, and each stage in the TEC package can include a different number of TECs as long as the TEC package heat transfer power in a cascading manner.

Electric connections 605 are used for powering the TECs. The internal routing of the electric connections 605 packaged within the multi-stage TEC section 609 is not illustrated in the figures. However, they can be in various parallel or series manners based on actual design requirements.

In FIG. 6A and FIG. 6C, the multi-stage TEC section 609 can function as a base 603 for heat sink fins 601 on the top of the TEC package. The heat sink fins 601 is part of the TEC package, and can be used as a cooling device that extracts heat from the TEC package to a fluid medium, such as airflow or a liquid coolant, where the heat is dissipated away from the TEC package.

In FIG. 6B, a liquid cooling cold plate 611 is on the top of the multi-stage section 609. Thermal interface material 611 may be used between the multi-stage section 609 and the liquid cooling code plate 611 if the liquid cooling cold plate 611 is a separate part from the TEC package. Different fluids can be used for operating the cold plate, such as single phase or phase change fluids.

In FIG. 6C, the example TEC package is similar to that illustrated in FIG. 6A, except that the embodiment here in FIG. 6C has a different sink base 608, which is narrower than the sink base 603 in FIG. 6A; and also includes a battery cell holder 623 as part of the TEC package.

In contrast, the TEC package in FIGS. 6A and 6B do not include an integrated battery cell holder. However, each TEC package can be attached to an external battery cell holder 623.

In FIGS. 6A-6C, a heat sink base and a TEC section 609 (also referred to as a TEC holder) are used interchangeably in the disclosure. When the TEC holder and the heat sink are combined as one unit, the TECs are packaged within the TEC holder and this holder can be also understood as the heat sink holder. In another embodiment, a cold plate can be used instead of the heat sink. When the cold plate and TEC holder are separate parts, they need to be assembled and therefore the thermal interface material 611 is needed. When they assembled together, the TEC holder can be directly attached to the cold plate to form a single package. Therefore, the three parts—the heat sink, the TEC section, and the battery cell holder—can be flexibly combined. For example, the heat sink and the TEC section can be combined, the TEC section and the battery cell holder can be combined, and all three parts can be combined.

Figure 7:
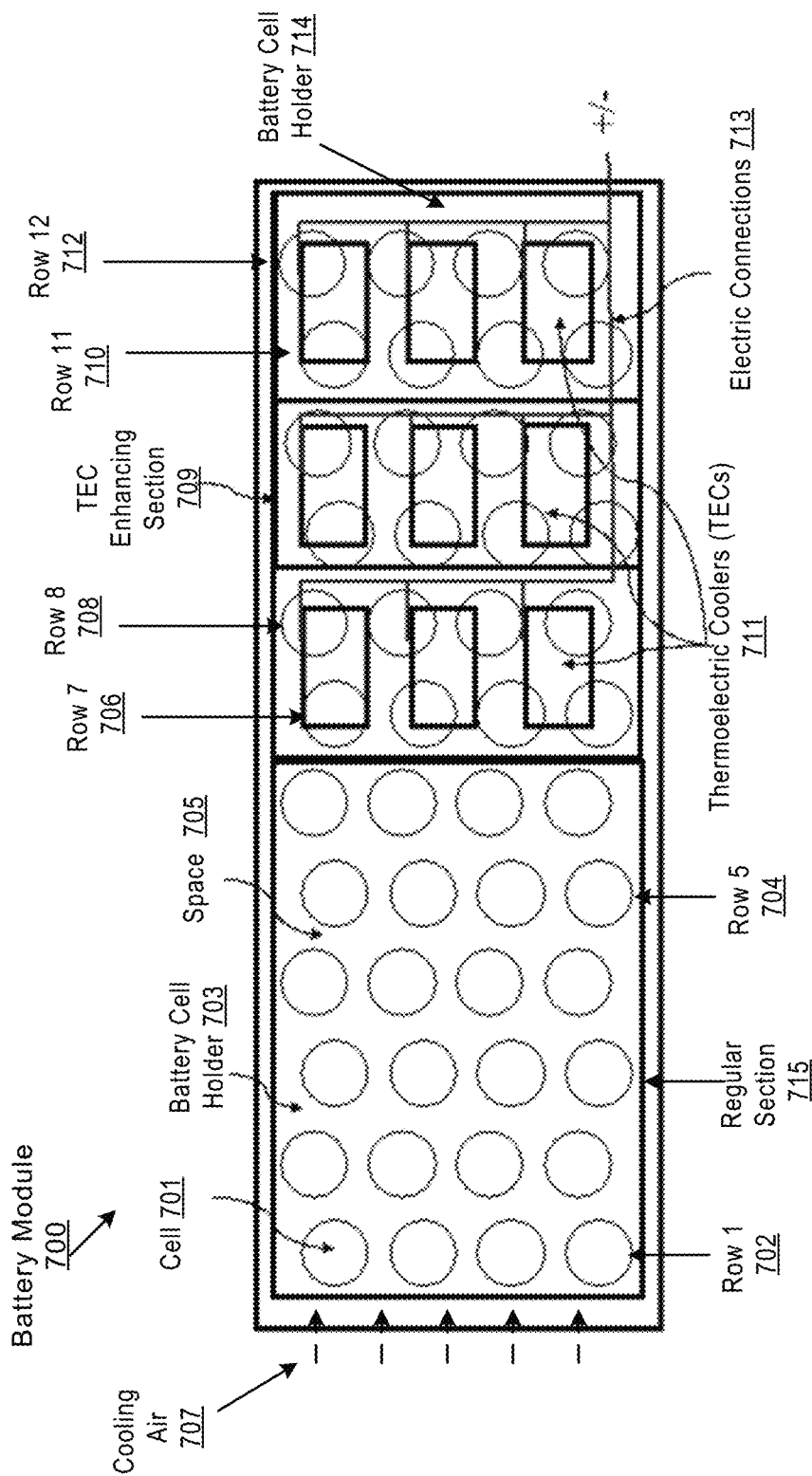
FIG. 7 shows a side view of a battery module with a TEC package according to one embodiment.

FIG. 7 shows a side view of a battery module 700 with a TEC package according to one embodiment. As shown, the battery module 700 can include battery cells (e.g., battery cell 701) assembled by battery cells holders 703 and 714. Space (e.g., space 705) exists between battery cells in the battery cell holders 703 and 714, such that the battery cell holders are not packed with battery cells jammed side by side.

In one embodiment, the battery module 700 can be divided into a regular section 715 and a TEC enhancing section 709. The regular section 715 includes battery cells ranging from rows 1 to row 6, and the TEC enhancing section 709 includes battery cells ranging from row 7 to row 12.

As described above, since cooling air 707 are blown into the battery module 700 from the left side, the temperature of the cooling air 707 may gradually increase as it travels through the battery cells from the left to the right, which results in a thermal gradient between the cooler battery cells on the left side and the warmer battery cells on the right side. Therefore, the battery cells in the regular section 715 are generally cooler than the battery cells in the TEC enhancing section 709.

In one embodiment, to maintain a similar temperature for all the battery cells in the battery module 700, a multi-stage cascaded TEC package can be integrated into the TEC enhancing section 709 to enhance the heat extraction of the battery cells in the section, and to enhance heat transfer of the battery cells. The multi-stage cascaded TEC package can include TECs 711 in three different stages to cover different regions of the TEC enhancing section 709.

In one embodiment, electric connections 713 that are connected to a discharging convertors of the battery module 700 are used to power the TECs 711. As such, the TECs 711 operate only when the battery cells are in a discharging mode. Detailed electric wiring is not described herein for each individual TEC.

As shown in the figure, the first stage of the TEC package corresponds to the first row of TECs, and covers battery cells in the $7^{th}$ row 706 and the $8^{th}$ row 708; the second stage of the TEC package corresponds to the second row of TECs, and covers battery cells in the $9^{th}$ row and the $10^{th}$ row; and the third stage of the TEC package corresponds to the third row of TECs, and covers battery cells in the $11^{th}$ row 710 and the $12^{th}$ row 712.

The number of TECs in each stage can be adjusted based on actual implementation requirements. However, the TECs in the second stage provides more enhanced cooling and heat transfer power than the TECs in the first stage. The TECs in the third stage of the TEC package can provide the most powerful heat transfer and thermal resistance reduction, since the temperature of battery cells in the $11^{th}$ row and the $12^{th}$ row may be the highest.

In one embodiment, the multi-stage cascaded TEC package can be implemented using the TEC packages as described in FIGS. 6A-6C, where each higher stage has a larger number of TECs compared to a lower stage. Alternatively, each higher stage can use more powerful TECs than a lower stage.

Battery cells in the battery module 700 can be divided into multiple smaller sections, instead of the regular section 725 and the TEC enhancing section 709. For example, each row of cells can be a section, and each three rows can be grouped as a section. Each of the smaller sections can be enhanced with a TEC package.

Figure 8:
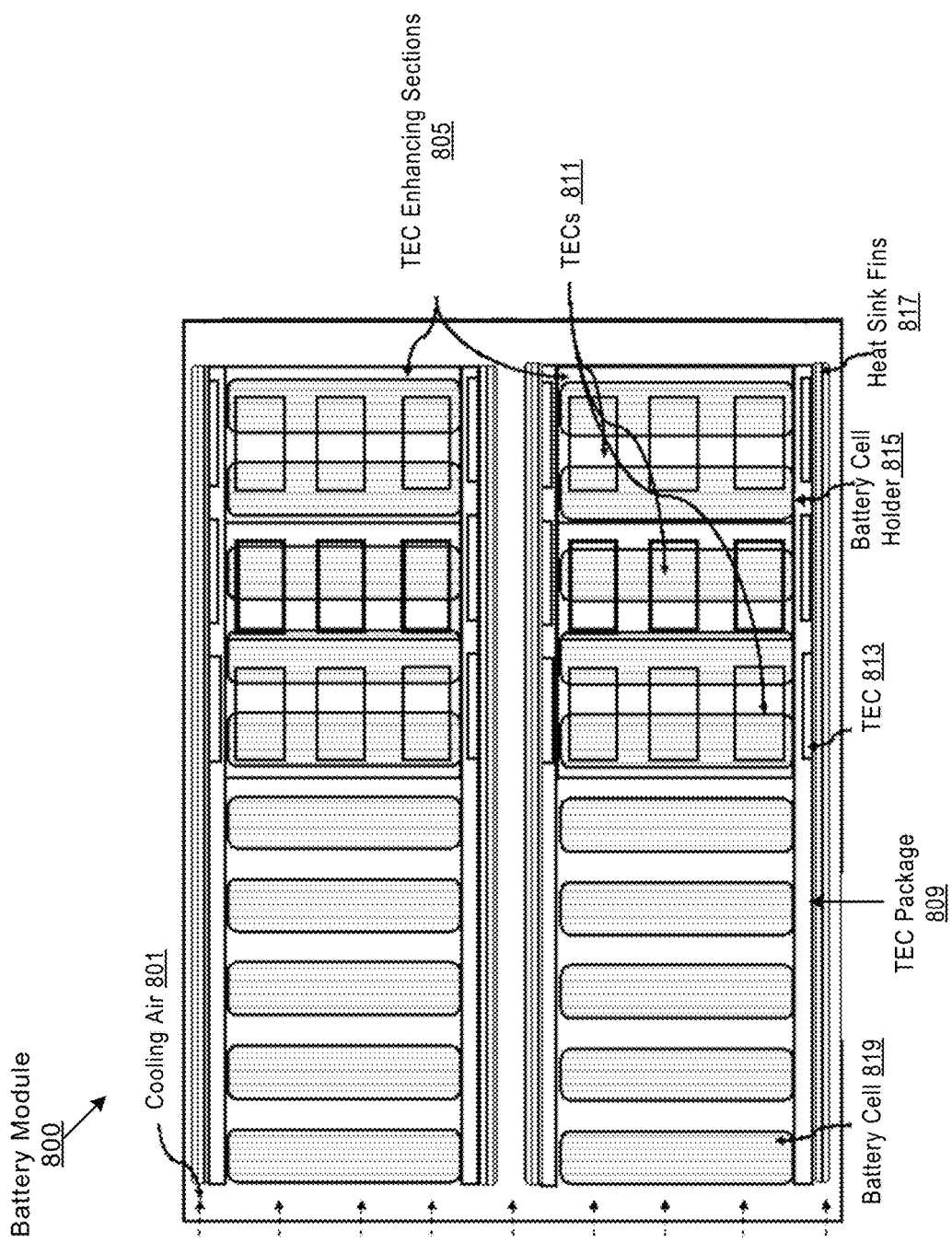
FIG. 8 shows a top view of a battery module using a TEC package according to one embodiment.

FIG. 8 shows a top view of a battery module 800 using a TEC package according to one embodiment. As shown that TECs 811 and 813 can be applied at different locations in TEC enhancing sections 805, either along the radial direction of the battery cells (e.g., battery cell 819) or the longitudinal direction of the battery cells, or both.

Battery cell holders (e.g., holder 815) are used in each of the TEC enhancing sections 815 on the edges of the battery cells to hold the battery cells. Each battery cell holder may have a structure similar to one of the battery holders 623 and 624 as shown in FIGS. 6A-6C. In one embodiment, the TEC package may be combined with a battery cell holder. After the combination, the TEC package can also function as a battery cell holder, and only certain locations within the TEC package are assembled with TECs. As shown in FIG. 8, the left side portion of the TEC package purely functions as a battery cell holder.

As an example, the battery cell holder 815, the TECs (e.g., TEC 813) and its corresponding package 809 (similar to TEC Section 609 in FIG. 6A-6B) and heat sink fins 817 may constitute a TEC package similar to one of the TEC packages described in FIGS. 6A and 6B.

Cooling air 801 can be used for cooling the entire battery module. Electronic connections to the TECs 811 and 813 are not shown in the figure.

Figure 9:
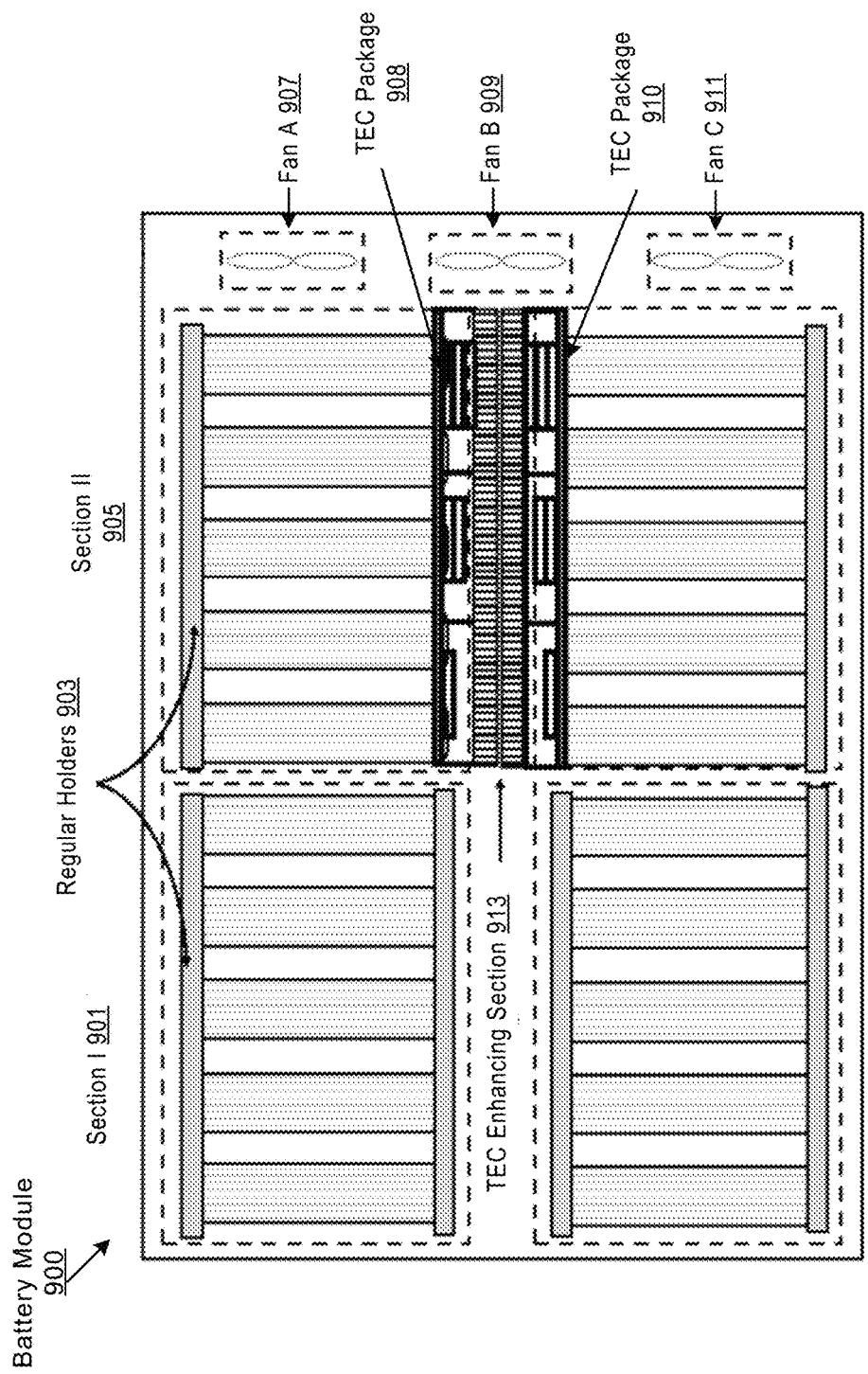
FIG. 9 shows an example of a TEC packaging design 900 with a battery module according to one embodiment.

FIG. 9 shows an example of a TEC packaging design 900 with a battery module according to one embodiment.

As shown, a battery module 900 can include section I 901 and section II 905. In this embodiment, although not shown, cooling air is blown through the battery module 900 from the section I 901 to the section II 905, which results in a thermal gradient. In one embodiment, battery cells in section I 901 are cooler than battery cells in section II 905 since the battery cells in section I 901 are closer to an inlet for the cooling air than the battery cells in section II 905.

As further shown, packaging structures in section I 901 and section II 905 are different. For example, regular battery cell holders 903 can be used for section I 90 on both ends of battery cells in the section. Section II 905 includes a TEC enhancing section 913 with a TEC package 908 and a TEC package 910. Each of the TEC packages 908 and 910 can be similar to the TEC package as described in FIG. 6C. Such a TEC package has heat sink fins on one end, and a battery cell holder on the other end.

In one embodiment, one end of battery cells in section II 905 are attached to the battery cell holder on one of the TEC packages 908 and 910, and the other end of the battery cells are attached to a regular battery cell holder. In another embodiment, which is not shown in FIG. 9, both ends of the battery cells in section II 905 can be attached to a battery cell holder associated with TECs. In yet another embodiment, the longitudinal area of the battery cells in section II 905 can also include TECs as illustrated in FIG. 8.

In one embodiment, a number of fans 907, 909 and 911 can be provided to facilitate airflows to pass through the battery module 900. The fan 909 is positioned close to one end of the TEC enhancing section 913 to facilitate the airflow through the middle channel between the two TEC packages 908 and 910. The positions of the fans 907, 909 and 911 can be adjusted according to actual implementations.

Figure 10:
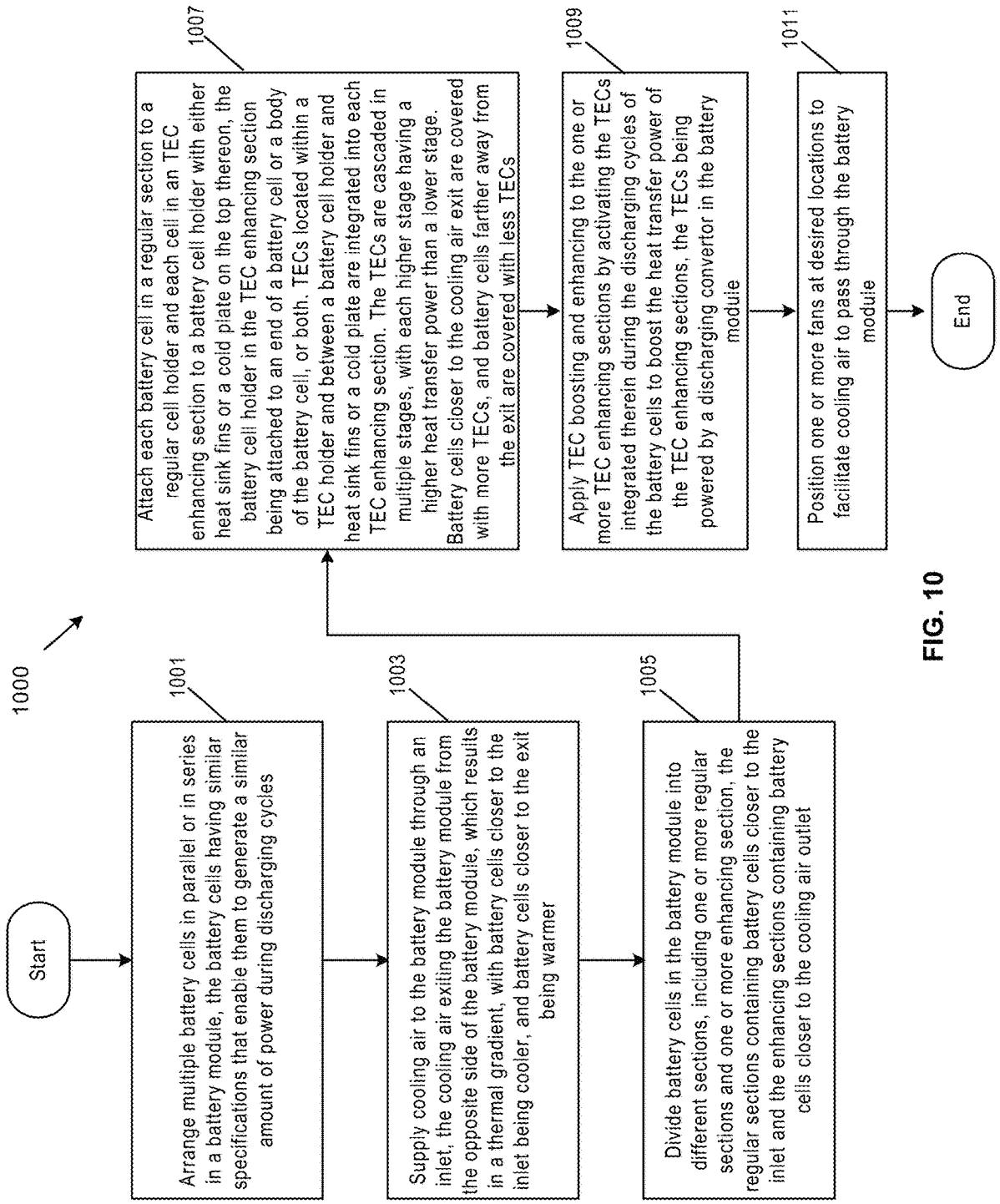
FIG. 10 is a flow diagram illustrating a process of using a cascaded TEC package to enhance transfer of heat in battery cells in a battery module according to an embodiment.

FIG. 10 is a flow diagram illustrating a process 1000 of using a cascaded TEC package to enhance transfer of heat of battery cells in a battery module according to an embodiment.

As shown in the FIG. 10, in block 1001, a number of battery cells in a battery module, such as a BBU, are arranged in parallel or in series. The battery cells in the battery module may possess similar specifications that enable them to generate a similar amount of power during discharging cycles.

In block 1003, cooling air is supplied to the battery module via an inlet, passes through the battery cells in the battery module, and exits the battery module via an outlet on the opposite side of the inlet. The temperature of the cooling air gradually increases as it passes through the battery module due to the heat generated by the battery cells during the discharging cycles, which results in a thermal gradient between the battery cells close to the inlet and the battery cells close to the outlet.

In block 1005, battery cells in the battery module are divided into different sections based on their distances to the inlet. Battery cells close to the inlet can be in a regular section while battery cells far away from the inlet and close to the outlet can be in a TEC enhancing section. Battery cells in the regular section are generally cooler than battery cells in the TEC enhancing section due to the thermal gradient described above.

In block 1007, each battery cell in the regular section is attached to a regular battery cell holder and each battery cell in the TEC enhancing section is attached to a battery cell holder with either heat sink fins or a cold plate on the top of the battery cell holder. The battery cell holder in the TEC enhancing section can be attached to an end of a battery cell or a body of the battery cell, or both. TECs located within a TEC holder and between a battery cell holder and heat sink fins or a cold plate are integrated into each TEC enhancing section. The TECs are cascaded in multiple stages, with each higher stage having a higher heat transfer power than a lower stage. Battery cells closer to the cooling air exit are covered with more TECs, and battery cells farther away from the exit are covered with less TECs.

In block 1009, the TECs integrated into the one or more TEC enhancing sections are activated during the discharging cycles of the battery cells enhance transfer of heat of the battery cells such that all battery cells in the battery module may have similar temperature despite the thermal gradient.

The higher heat transfer power in a higher stage can be created by a larger number of TECs or the same number of more powerful TECs in comparison to a lower stage. The number of TECs in each stage or in a different section of the battery module can be adjusted based on specific implementation requirements.

In block 1011, a number of fans are positioned at different locations based on design requirements of the battery module to facilitate the cooling air to pass through the battery module. The fans can be of a variety of types and can be placed on either the inlet side or the outlet side of the battery module.

Figure 11:
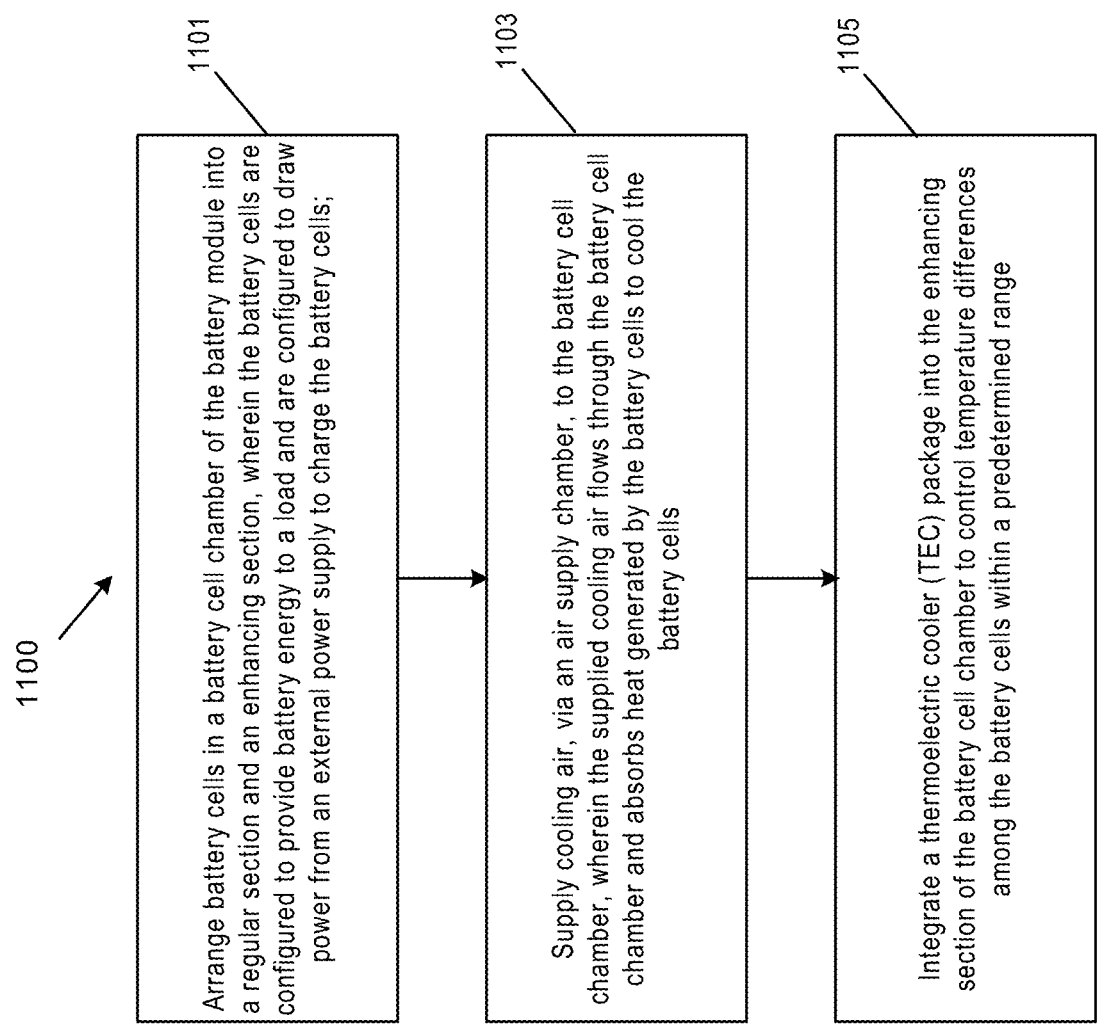
FIG. 11 is a flow diagram illustrating another process of using a cascaded TEC package to enhance transfer of heat in battery cells in a battery module according to an embodiment.

FIG. 11 is a flow diagram illustrating another process 1100 of using a cascaded TEC package to enhance transfer of heat in battery cells in a battery module according to an embodiment.

As shown in the figure, in block 1101, battery cells in a battery cell chamber of a battery module are arranged into a regular section and an enhancing section, wherein the battery cells are configured to provide battery energy to a load and are configured to draw power from an external power supply to charge the battery cells.

In block 1103, cooling air is supplied, via an air supply chamber, to the battery cell chamber. The supplied cooling air flows through the battery cell chamber and absorbs heat generated by the battery cells to cool the battery cells.

In block 1105, a thermoelectric cooler (TEC) package is integrated into the enhancing section of the battery cell chamber to control temperature differences among the battery cells within a predetermined range.

Figure 12:
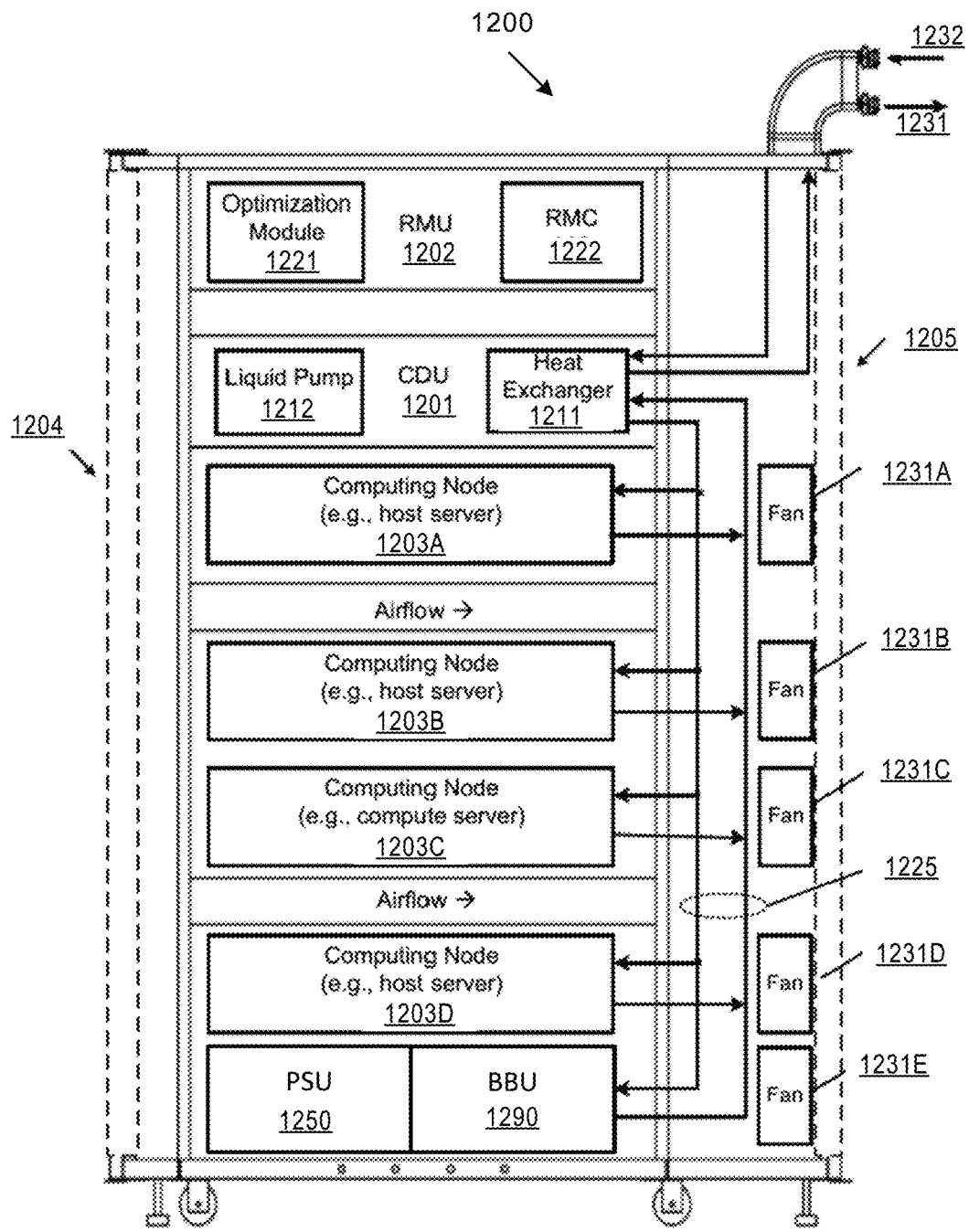
FIG. 12 is a block diagram illustrating an example of an electronic rack according to one embodiment.

FIG. 12 is a block diagram illustrating an example of an electronic rack according to one embodiment. Electronic rack 1200 may include one or more server slots to contain one or more servers respectively. Each server includes one or more information technology (IT) components (e.g., processors, memory, storage devices, network interfaces). According to one embodiment, electronic rack 1200 includes, but is not limited to, CDU 1201, rack management unit (RMU) 1202 (optional), a power supply unit (PSU) 1250, the BBU 1190 (which may include one or more battery modules as described herein) and one or more server blades 1203A-1203D (collectively referred to as server blades 1203). Server blades 1203 can be inserted into an array of server slots respectively from frontend 1204 or backend 1205 of electronic rack 1200. The PSU 1250 and/or BBU 120 may be inserted into any of server slots 1203 within the electronic rack 1200. In one embodiment, one or more BBUs may be inserted into any of server slots 1203 within the electronic rack 1200.

Note that although there are only four server blades 1203A-1203D shown here, more or fewer server blades may be maintained within electronic rack 1200. Also note that the particular positions of CDU 1201, RMU 1202, PSU 1250, BBU 1210, and server blades 1203 are shown for the purpose of illustration only; other arrangements or configurations of CDU 1201, RMU 1202, BBU 1290, and server blades 1203 may also be implemented. Note that electronic rack 1200 can be either open to the environment or partially contained by a rack container, as long as the cooling fans can generate airflows from the frontend to the backend.

In addition, a fan module can be associated with each of the server blades 1203, and the BBU 1290. In this embodiment, fan modules 1231A-1231E, collectively referred to as fan modules 1231, and are associated with server blades 1203A-1203D, respectively. Each of the fan modules 1231 includes one or more cooling fans. Fan modules 1231 may be mounted on the back ends of server blades 1203 and BBU 1290 to generate airflows flowing from frontend 1204, traveling through the air space of the sever blades 1203, and existing at backend 1205 of electronic rack 1200. In one embodiment, each of the fan modules may be mounted on the back ends of the server blades 1203 and one or more BBU 1290. For example, a fan module (e.g., 1231E) may pull the warmed air 23 into the air exhaust chamber 21 of a battery module (e.g., module 20) of the BBU 1290 and expel the air out of the module and the BBU. In another embodiment, one or more of the fan modules may be positioned on the frontend 1204 of the rack 1200. Such frontend fans may be configured to push air into the server blades 1203 and/or the BBU 1290.

In one embodiment, CDU 1201 mainly includes heat exchanger 1211, liquid pump 1212, and a pump controller (not shown), and some other components such as a liquid reservoir, a power supply, monitoring sensors and so on. Heat exchanger 1211 may be a liquid-to-liquid heat exchanger. Heat exchanger 1211 includes a first loop with inlet and outlet ports having a first pair of liquid connectors coupled to external liquid supply/return lines 1231-1232 to form a primary loop. The connectors coupled to the external liquid supply/return lines 1231-1232 may be disposed or mounted on backend 1205 of electronic rack 1200. The liquid supply/return lines 1231-1232 are coupled to a set of room manifolds, which are coupled to an external heat removal system, or extremal cooling loop. In addition, heat exchanger 1211 further includes a second loop with two ports having a second pair of liquid connectors coupled to liquid manifold 1225 to form a secondary loop, which may include a supply manifold to supply cooling liquid to server blades 1203 and a return manifold to return warmer liquid back to CDU 1201. Note that CDUs 1201 can be any kind of CDUs commercially available or customized ones. Thus, the details of CDUs 1201 will not be described herein.

Each of server blades 1203 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. Server blades 1203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 1200 further includes optional RMU 1202 configured to provide and manage power supplied to servers 1203, fan modules 1231, and CDU 1201. Optimization module 1221 and RMC 1222 can communicate with a controller in some of the applications. RMU 1202 may be coupled to PSU 1250 to manage the power consumption of the PSU. The PSU 1250 may include the necessary circuitry (e.g., an alternating current (AC) to direct current (DC) or DC to DC power converter, backup battery, transformer, or regulator, etc.,) to provide power to the rest of the components of electronic rack 1200.

In one embodiment, RMU 1202 includes optimization module 1221 and rack management controller (RMC) 1222. RMC 1222 may include a monitor to monitor operating status of various components within electronic rack 1200, such as, for example, computing nodes 1203, CDU 1201, and fan modules 1231. Specifically, the monitor receives operating data from various sensors representing the operating environments of electronic rack 1200. For example, the monitor may receive operating data representing temperatures of the processors, cooling liquid, and airflows, which may be captured and collected via various temperature sensors. The monitor may also receive data representing the fan power and pump power generated by the fan modules 1231 and liquid pump 1212, which may be proportional to their respective speeds. These operating data are referred to as real-time operating data. Note that the monitor may be implemented as a separate module within RMU 1202.

Based on the operating data, optimization module 1221 performs an optimization using a predetermined optimization function or optimization model to derive a set of optimal fan speeds for fan modules 1231 and an optimal pump speed for liquid pump 1212, such that the total power consumption of liquid pump 1212 and fan modules 1231 reaches minimum, while the operating data associated with liquid pump 1212 and cooling fans of fan modules 1231 are within their respective designed specifications. Once the optimal pump speed and optimal fan speeds have been determined, RMC 1222 configures liquid pump 1212 and cooling fans of fan modules 1231 based on the optimal pump speed and fan speeds.

As an example, based on the optimal pump speed, RMC 1222 communicates with a pump controller of CDU 1201 to control the speed of liquid pump 1212, which in turn controls a liquid flow rate of cooling liquid supplied to the liquid manifold 1225 to be distributed to at least some of server blades 1203. Therefore, the operating condition and the corresponding cooling device performance are adjusted. Similarly, based on the optimal fan speeds, RMC 1222 communicates with each of the fan modules 1231 to control the speed of each cooling fan of the fan modules 1231, which in turn control the airflow rates of the fan modules 1231. Note that each of fan modules 1231 may be individually controlled with its specific optimal fan speed, and different fan modules and/or different cooling fans within the same fan module may have different optimal fan speeds.

Note that some or all of the IT components of servers 1203 (e.g., 1203A, 1203B, 1203C, and/or 1203D) may be attached to any one of the cooling devices described above, either via air cooling using a heatsink or via liquid cooling using a cold plate. One server may utilize air cooling while another server may utilize liquid cooling. Alternatively, one IT component of a server may utilize air cooling while another IT component of the same server may utilize liquid cooling. In addition, a switch is not shown here, which can be either air cooled or liquid cooled.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

As previously explained, an embodiment of the disclosure may be (or include) a non-transitory machine-readable medium (such as microelectronic memory) having stored thereon instructions, which program one or more data processing components (generically referred to here as a "processor") to perform airflow management operations, such as controlling fan speed of one or more fans of the battery module (and/or BBU shelf). In other embodiments, some of these operations might be performed by specific hardware components that contain hardwired logic. Those operations might alternatively be performed by any combination of programmed data processing components and fixed hardwired circuit components of any of the battery modules described herein.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A battery module, comprising:
    a battery cell chamber that includes battery cells configured to provide battery energy to a load and are configured to draw power from an external power supply to charge the battery cells;
    an air supply chamber that is configured to supply cooling air into the battery cell chamber, wherein the supplied cooling air flows through the battery cell chamber and absorbs heat generated by the battery cells to cool the battery cells; and
    a thermoelectric cooler (TEC) package integrated into the battery cell chamber to control temperature differences among the battery cells within a predetermined range, wherein the TEC package is to directly assemble TECs in a plurality of stages, and wherein the TECs are directly attached to the battery cells at both ends of each battery cell and along a body of the battery cell in the battery cell chamber, wherein the TEC package is connected to a discharging convertor circuit of the battery module via electronic wires, and wherein the TEC package functions only when the battery cells in the battery cell chamber are in a discharging mode.

2. The battery module of claim 1, wherein each stage of the plurality of stages in the TEC package is attached to battery cells at a different section in the battery cell chamber.

3. The battery module of claim 2, wherein the TEC package includes a first stage and a second stage, wherein the second stage is a higher stage than the first stage, wherein TECs in the first stage are attached to a first set of one or more battery cells, and TECs in the second stage are attached to a second set of one or more battery cells.

4. The battery module of claim 3, wherein the second set of one or more battery cells are closer to an outlet for the cooling air than the first set of one or more battery cells.

5. The battery module of claim 3, wherein the TECs in the second stage are configured to provide more powerful heat transfer capability, to the second set of one or more battery cells than the TECs in the first stage to the first set of one or more battery cells, wherein the more powerful heat transfer capability in the second stage is achieved using a larger number of TECs than the first stage.

6. The battery module of claim 1, wherein each TEC in the TEC package is attached to a battery cell in a longitudinal direction or in a radial direction.

7. The battery module of claim 1, wherein the TEC packages include a heat sink or a cold plate on one end and a battery cell holder on the other end.

8. The battery module of claim 1, wherein battery cells in the battery cell chamber are divided into one or more regular sections and one or more enhancing sections, wherein the TEC package is applied to battery cells only in the one or more enhancing sections.

9. The battery module of claim 8, wherein a regular battery cell holder assembles the battery cells in each of the one or more regular sections, and wherein a battery cell holder with TECs therein assembles the battery cells in each of the one or more enhancing sections.

10. A method of regulating temperatures using thermoelectric coolers (TECs) in a battery module, the method comprising:
    arranging battery cells in a battery cell chamber of the battery module, wherein the battery cells are configured to provide battery energy to a load and are configured to draw power from an external power supply to charge the battery cells;
    supplying cooling air, via an air supply chamber, to the battery cell chamber, wherein the supplied cooling air flows through the battery cell chamber and absorbs heat generated by the battery cells to cool the battery cells; and integrating a thermoelectric cooler (TEC) package into the enhancing section of the battery cell chamber to control temperature differences among the battery cells within a predetermined range, wherein the TEC package is to directly assemble TECs in a plurality of stages, and wherein the TECs are directly attached to the battery cells at both ends of each battery cell and along a body of the battery cell in the battery cell chamber, wherein the TEC package is connected to a discharging convertor circuit of the battery module via electronic wires, and wherein the TEC package functions only when the battery cells in the battery cell chamber are in a discharging mode.

11. The method of claim 10, wherein each stage of the plurality of stages in the TEC package is attached to battery cells at a different section in the battery cell chamber.

12. The method of claim 11, wherein the TEC package includes a first stage and a second stage, wherein the second stage is a higher stage than the first stage, wherein TECs in the first stage are attached to a first set of one or more battery cells, and TECs in the second stage are attached to a second set of one or more battery cells.

13. The method of claim 12, wherein the second set of one or more battery cells are closer to an outlet for the cooling air than the first set of one or more battery cells.

14. The method of claim 12, wherein the TECs in the second stage are configured to provide more powerful heat transfer capability to the second set of one or more battery cells than the TECs in the first stage to the first set of one or more battery cells, wherein the more powerful heat transfer capability in the second stage is achieved using a larger number of TECs than the first stage.

15. The method of claim 10, wherein each TEC in the TEC package is attached to a battery cell in a longitudinal direction or a radial direction.

16. The method of claim 10, wherein the TEC packages include a heat sink or a cold plate on one end and a battery cell holder on the other end.

17. The method of claim 10, wherein battery cells in the battery cell chamber are divided into a regular section and an enhancing section, wherein the TEC package is applied to battery cells only in the enhancing section.

18. The method of claim 17, wherein a regular battery cell holder assembles the battery cells in each of the one or more regular sections, and wherein a battery cell holder with TECs therein assembles the battery cells in each of the one or more enhancing sections.

19. The battery module of claim 8, wherein the TECs in the TEC package are part of a structure within a TEC holder that assembles battery cells in each of the one or more enhancing sections.

20. The method of claim 17, wherein the TECs in the TEC package are part of a structure within a TEC holder that assembles battery cells in each of the one or more enhancing sections.

* * * * *